(12) United States Patent
Zhang

(10) Patent No.: US 11,176,739 B1
(45) Date of Patent: *Nov. 16, 2021

(54) ENHANCING TETRAHEDRAL MESHING FOR SELF-INTERSECTING BOUNDARIES

(71) Applicant: ANSYS, INC., Canonsburg, PA (US)

(72) Inventor: Hanzhou Zhang, Sewickley, PA (US)

(73) Assignee: ANSYS, INC., Canonsburg, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/858,117

(22) Filed: Apr. 24, 2020

(51) Int. Cl.
*G06T 17/20* (2006.01)
*G06F 30/10* (2020.01)

(52) U.S. Cl.
CPC .............. *G06T 17/20* (2013.01); *G06F 30/10* (2020.01); *G06T 17/205* (2013.01)

(58) Field of Classification Search
CPC ........ G06T 17/20; G06T 17/205; G06F 30/10
See application file for complete search history.

(56) References Cited

U.S. PATENT DOCUMENTS

| | | | |
|---|---|---|---|
| 2018/0031721 A1* | 2/2018 | Etiene Queiroz ....... | G06T 17/05 |
| 2020/0034497 A1* | 1/2020 | Goswami ................ | G06F 30/00 |
| 2020/0211281 A1* | 7/2020 | Randon .................. | G06T 17/20 |

OTHER PUBLICATIONS

Jonathan Richard Skewchuk, "Tetrahedral Mesh Generation by Delaunay Refinement", Proc. 14th Annu. ACM Sympos. Comput. Geom, 1998, 11 pages.
M.A.S. Lizier, et al. "Comparing Techniques For Tetrahedral Mesh Generation", Inaugural International Conference of the Engineering Mechanics Institute, Jan. 2008, 8 pages.

* cited by examiner

*Primary Examiner* — David T Welch
(74) *Attorney, Agent, or Firm* — Womble Bond Dickinson (US) LLP (57) ABSTRACT

Existing tetrahedral meshing which require watertight and intersection free triangular mesh as input can be enhanced to tolerate and respect self-intersecting boundaries. After an initial tetrahedral mesh constructed with all input nodes, intersecting faces can be recovered using the proposed method. Starting from one of the intersecting faces, a set of intersecting faces around it can be detected, and a surrounding region can be sculpted out to form a void. Two intersection-free and topologically separate cavities can then be defined within the void and meshed independently. After stitching the meshes from the two cavities back to the original initial mesh, the existing tetrahedral meshing can continue with the regular meshing steps such as refinement etc. to finish tetrahedral meshing. In one special case when we have two points at the same location, in order to insert the second of the two points, a method can offset the second point inwardly into the mesh region a small little bit and then revert back the second point to its original location after meshing is done. The user input is not altered or mesh quality would not be affected because the point movement is small.

20 Claims, 7 Drawing Sheets

ENHANCING TETRAHEDRAL MESHING FOR SELF-INTERSECTING BOUNDARIES

BACKGROUND

Designers and manufacturers are increasingly using computer aided design (CAD) and computer aided engineering (CAE) systems, such as computers that execute simulation software, to design products such as automobiles, airplanes, airplane engines, heating and cooling systems, etc. The use of such CAD and CAE systems allows the designers and manufacturers to test out different designs using the software without requiring that the design be built. For example, thermo-mechanical fatigue testing or thermal analysis of a proposed product, based on a design, can be performed on a simulated design of the product before the product is fabricated to determine when and how the product will fail. Similarly, a design of an airplane's wing, or other part, can be tested in the CAD or CAE system before the wing is fabricated to determine how well the wing will behave based on, for example, fluid flow of air around the wing while in flight. This testing by simulation can allow a designer to consider different possible designs and reject some of them based on the results of the simulation before the product is even fabricated. Moreover, results of one or more simulations can cause a designer to revise the design to improve its behavior or performance.

Such simulations often use computational meshes that are generated over the simulated physical space of a physical object that is being simulated. For example, finite element methods that are used in physics-based simulations of a physical object typically require the generation of a mesh throughout the space of the simulated physical object. These meshes are often constructed from tetrahedral elements that are created in, for example, an incremental Delaunay algorithm. Existing tetrahedral meshing methods require watertight and intersection-free triangular mesh as input. However, self-intersecting boundaries can appear in geometric models due to modeling errors or can be introduced during simulation due to numerical imprecision. For example, the generation of a mesh can fail to be completed when a structure's geometry or topology produces what appears to be intersections of itself in the triangular mesh input. In order to achieve successful tetrahedral mesh generation, the surface mesh often needs to be repaired or intersections need to be manually removed. This is not always possible or can cause other issues such as violating user input or non-optimal meshing quality, etc.

SUMMARY OF THE DESCRIPTION

An improved meshing method and system detects intersecting, touching or near touching faces in an input surface mesh on a structure starting from one unrecovered boundary face in an initial tetrahedral mesh generated by, for example, an existing Delaunay algorithm that is known in the art, and then creates two cavities around the intersection, where one cavity is for one side where the intersection occurs and the other cavity is for the other side where the intersection occurs. Although there still exists the intersection between the two cavities, each cavity is otherwise intersection-free within itself. A mesh is then generated within each cavity, using the boundary faces that were not recovered in the initial meshing process. The meshes within each cavity are generated independently and then are stitched back together with the other portion of the initial mesh to yield a mesh with the input intersecting boundary faces respected. A final mesh can be generated by applying the further steps of an existing meshing algorithm, such as refinement, and quality improvement etc. without any modifications. This method is particularly useful for structures that are prone to self-intersections (e.g., a cotter pin or a structure with a self-contacting part) and for fracture models in which crack surfaces are close and often touching or intersecting during simulation.

In one embodiment, a method described herein can include the following operations: generating an initial tetrahedral mesh for a simulation of a physical object whose surface mesh may include intersecting faces, (and in one embodiment, in cases where two nodes appear at the same location, a slight displacement will be made to either one of the nodes to ensure both nodes can be inserted, and in the end the displaced node will be restored back to its original location); recovering the faces from the surface mesh after the initial tetrahedral mesh is generated while some faces will not able to recovered due to one or more intersections; detecting two sets of intersecting faces around a unrecovered face to sculpt out a surrounding region from the initial mesh and forming two cavities with the two sets of intersecting faces; generating tetrahedral meshes in each of the two cavities defined; and stitching the new meshes back together with the rest portion of the initial mesh, the portion defined by the initial mesh without the sculpted region. In one embodiment, the two cavities are topologically separate and are intersection-free within themselves although they interest each other geometrically.

In one embodiment, the detecting of the two sets of intersecting faces further include the operations of: from an unrecovered face, finding a face intersecting with it, propagating through their neighbors to find all intersecting or penetrating faces until both sides emerge out from intersection. In one embodiment, the method can further include the operation of: identifying, based on the two sets of intersecting faces (that can be referred to as cap faces) and the mesh nodes associated with them, a list of adjacent tetrahedral elements that define a region to be sculpted out. Each side's cap faces lie inside of the sculpted region and are to be used to form a cavity together with some of the boundary faces of the sculpted region. Eventually two cavities are formed with one for each side.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in nonvolatile memory, such as flash memory, or dynamic random access memory (DRAM) which is volatile or other forms of memory.

The above summary does not include an exhaustive list of all embodiments are aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 1C shows the physical object in FIG. 1B after a surface mesh has been generated which includes a set of intersecting faces across the boundary faces of the physical object. FIG. 1C is a simplified view that does not include all of the triangles in a surface mesh so that the intersection can be easily seen in the view.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1A:
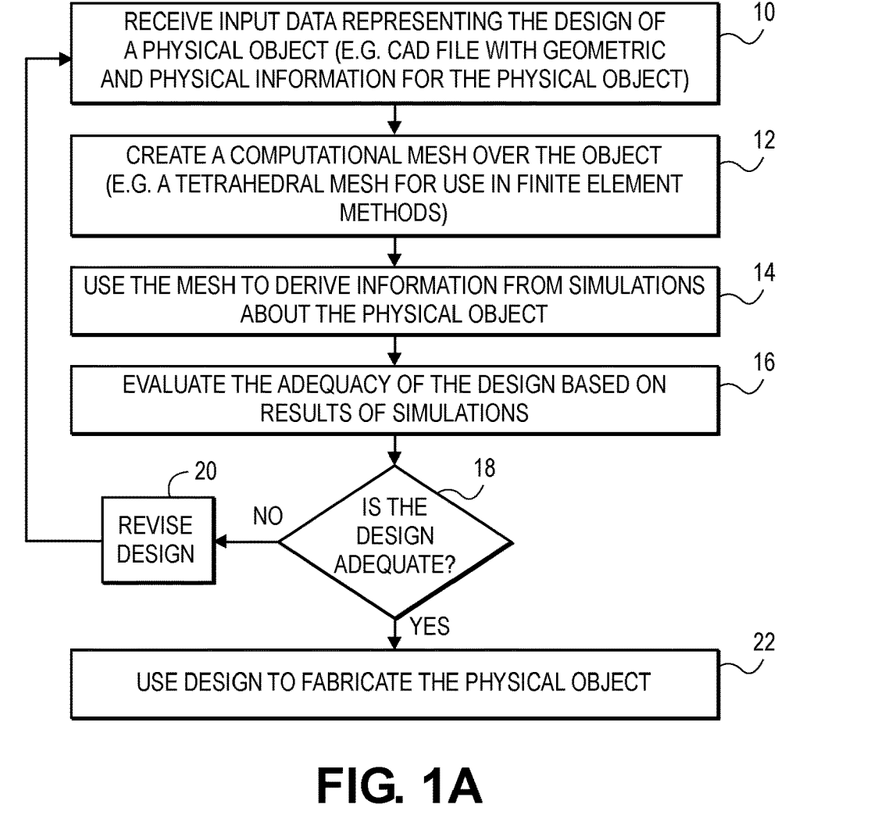
FIG. 1A shows a flowchart which illustrates a method that can be used with one or more embodiments described herein.

The methods and embodiments described herein can be used in the context of multi-physics simulation systems (such as a data processing system that executes simulation software from Ansys, Inc. of Canonsburg, Pa.) that can be used to design a product and design how the product can be fabricated or manufactured, and FIG. 1A shows an example of such a simulation method. In operation 10 of FIG. 1A, a data processing system can receive input data that represents the design of a physical system or physical object; the input data can be in the form of a CAD (computer aided design) file or a CAE file which includes information about the geometry (in three dimensional space) about the object (or set of objects) and information about physical properties of the object (or set of objects) such as the material composition of the object, etc. In operation 12, the data processing system can create a computational mesh in the space occupied by the object (or set of objects). For example, the data processing system can create a tetrahedral mesh for use in finite element methods. These finite element methods can, in operation 14, be used to derive information from the one or simulations that use the mesh; for example, in the case of a simulation involving thermal design parameters such as temperature, etc., the results from the simulation can be used to determine if certain thermal targets, such as maximum operating temperature, will be achieved based on the current design. Then in operations 16 and 18, a designer of the physical object can evaluate the results of the one or more simulations to determine the adequacy of the design relative to desired goals or specifications (such as maximum operating temperature, for example). If the design is not adequate or does not achieve desired goals or specifications, then the design can be revised in operation 20; for example, portions of the physical object can be changed in various ways to revise the design, and the method can repeat by looping back to operation 10 for one or more new simulations based on the revised design. If operation 18 determines that the design is adequate and achieves the desired goals and/or specifications for the object, then in operation 22, the design (e.g., in the form of a CAD file or a CAE file) can be used to fabricate or manufacture the physical object. The embodiments described herein can provide improved tetrahedral meshing methods (e.g., used in operation 12 of FIG. 1A) that will work well even when there are self-intersections in the input surface mesh. Thus, these methods can work for simulations of physical structures that have self-contacting surfaces or fracture models, etc.

Figure 1B:
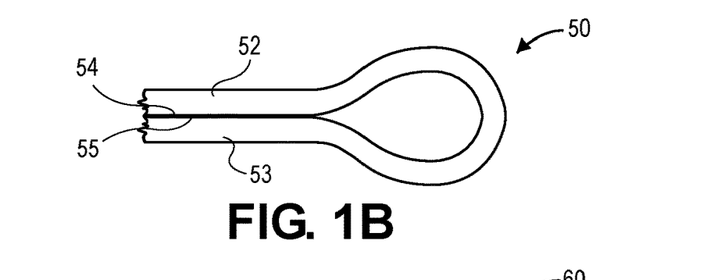
FIG. 1B shows a physical object to be simulated in a simulation.
Figure 1C:
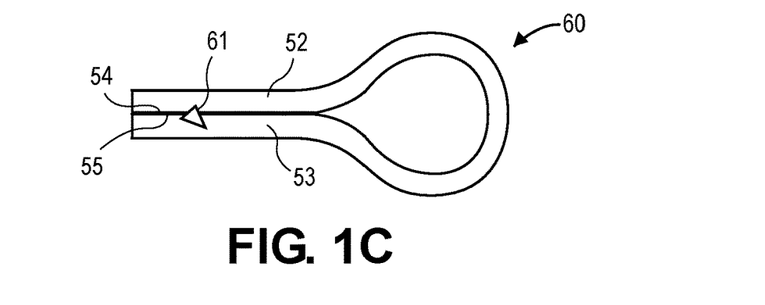
Figure 5:
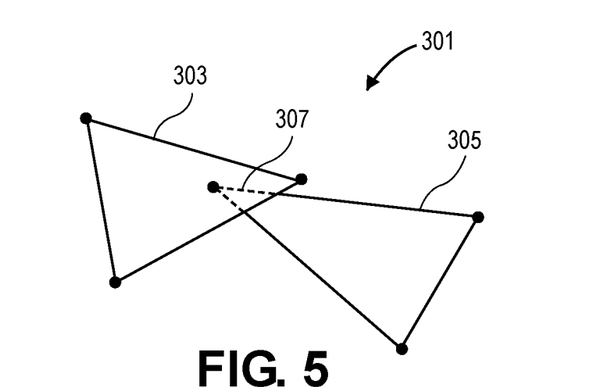
FIG. 5 shows an example of a pair of intersecting faces which can be used to begin a method according to an embodiment described herein.

FIGS. 1B and 1C show an example of a physical object and a simulation of the physical object where a mesh has been created throughout the physical object. In particular, FIG. 1B shows a physical object 50 which can be a cotter pin or other physical object that has self-contacting surfaces or nearly self-contacting surfaces. The physical object 50 has a first portion 52 (e.g., a first tine) and a second portion 53 (e.g., a second tine) which can be either contacting or nearly contacting each other at their respective exterior surfaces. The first portion 52 includes an exterior surface 54 which is in contact with or nearly in contact with the exterior surface 55 of the second portion 53. As shown in FIG. 1B, the exterior surface 54 may touch the exterior surface 55. FIG. 1B can be a side view of the physical object 50 or a cross-sectional view of the physical object 50. When a surface mesh is created for the physical object 50 in a simulation of the physical object 50, the surface mesh may include one or more intersecting faces, and FIG. 1C shows an example of a set of intersecting faces 61 from a side view of the meshed physical object 60 (which can be created in a simulation of the physical object in a data processing system which may be executing multi-physics simulation software). In the example shown in FIG. 1C, at least one triangular face extends from portion 53 into portion 52 and thus penetrates both portions 52 and 53 and also penetrates and intersects the boundary faces that represent the exterior surfaces 54 and 55. Normally, there are multiple intersecting faces which may penetrate a boundary surface in a typical example of a self-intersection. In the example shown in FIG. 1C, the exterior surface 54 is represented by a set of faces such as triangles in the surface mesh and the exterior surface 55 is represented by another set of faces that are triangles in the surface mesh; these faces may not be recoverable using conventional tetrahedral meshing techniques as a result of the penetration for the intersecting faces. FIG. 5 shows an example of a pair of intersecting faces 301. In this pair of intersecting faces 301, a face 305 intersects with and penetrates face 303 at the intersection 307. Thus a node of the face 305 penetrates or extends beyond the face 303 as shown in FIG. 5. It will be appreciated that multiple faces will typically intersect one or more faces in a surface mesh and the set of intersecting faces may include more than one penetrating node. In one embodiment, the boundary faces should have consistent normals (i.e. all the face normals point inwardly or outwardly).

Figure 2:
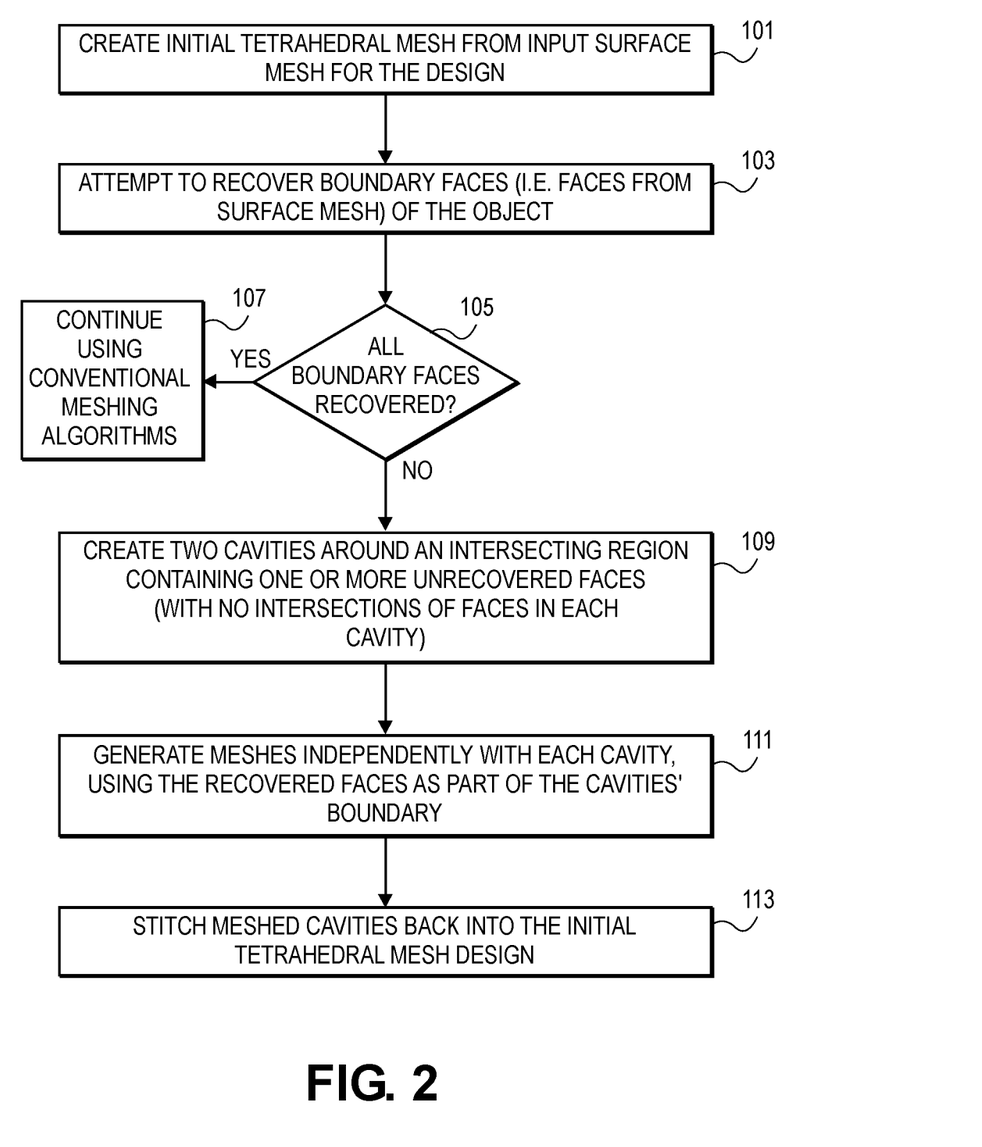
FIG. 2 shows a flowchart which illustrates a general method according to one embodiment described herein.

An input surface mesh that includes intersecting faces can be processed with a method described herein that is capable of creating a fully processed tetrahedral mesh. FIG. 2 shows a generalized method that can be used, in one embodiment, to process an initial tetrahedral mesh that includes a set of intersecting faces and at least one unrecovered face. In operation 101, a data processing system can create an initial tetrahedral mesh from nodes from input surface mesh. In one embodiment, for duplicated nodes, they can be offset a tiny distance inwardly in the volume to avoid any complications resulting from the duplicated nodes. Then in operation 103, the system can attempt to recover boundary faces of the object using, for example existing boundary recovery methods. These existing boundary recovery methods will not recover intersecting faces. As a result, there may be some faces, such as a face (a triangle) that was in the original surface mesh but did not get included in the initial tetrahedral mesh created in operation 101, which are not recovered. Operation 105 detects those unrecovered faces if they exist. If all faces are recovered, operation 105 proceeds to operation 107 which can continue to use conventional meshing algorithms to complete the creation of a computational mesh which can be used in simulations as described herein. On the other hand, if operation 105 determines that one or more boundary faces have not been recovered, then processing proceeds to operation 109. In operation 109, the data processing system in one embodiment sculpts out a void and creates two cavities (also referred to as regions) around an intersecting region containing one or more unrecovered faces. Each of those cavities will be intersection free in that no faces within each cavity will intersect in one embodiment. Then in operation 111, the data processing system can generate meshes within each cavity. In one embodiment, each of the meshes are generated independently with the same meshing algorithm within each cavity using the recovered faces as part of its boundary of each cavity. The void sculpted out in the initial tetrahedral mesh is filled by stitching the meshed cavities from operation 111 back to complete the design in operation 113. In one embodiment, the two cavities are topologically separate and intersection free within their own boundaries, and the meshes created within each cavity are created independently relative to the other cavity and may be created using the same meshing algorithm within each cavity. In one embodiment, each cavity may be defined by a set of faces consisting of interfacing triangles between tetrahedron sculpted and tetrahedron kept, and some boundary triangles in the input surface mesh including the boundary faces to be recovered around the intersection region (which can be referred to as cap faces). The method shown in FIG. 2 can be used to generate a mesh for a structure which has self-intersections without modifying or repairing the input surface mesh. Further, this method does not suffer from quality issues that can happen in other approaches that attempt to repair or remove self-intersection before tetrahedral meshing can proceed. Moreover, this method can support a non-manifold topology such as T-junctions or hanging faces which are often seen in fracture growth simulations (for example, in fracture models).

Figure 3A:
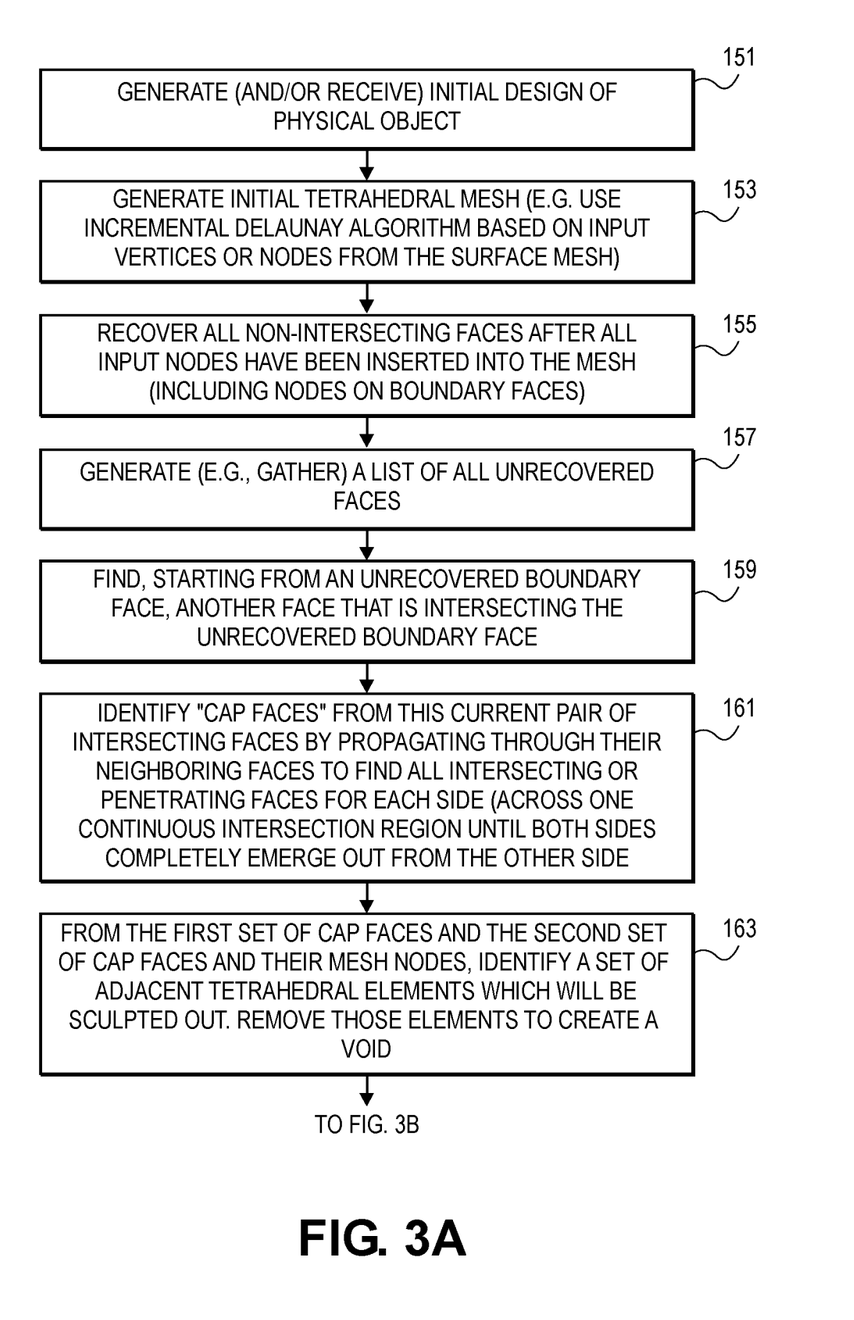
FIGS. 3A and 3B together show a flowchart which illustrates a method according to one embodiment described herein.
Figure 3B:
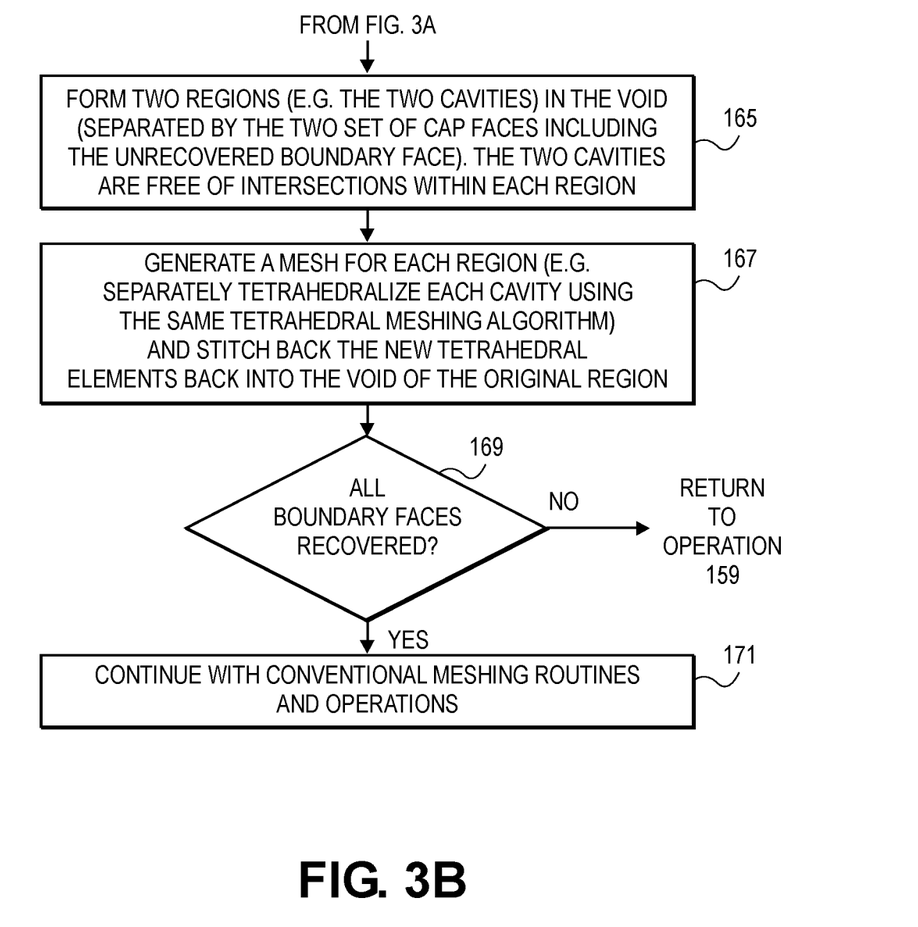

FIGS. 3A and 3B show another example of a method according to an embodiment described herein. In operation 151, a data processing system can generate or receive an initial design of a physical object or a physical system which can include a plurality of physical objects. The initial design may be in the form of a CAD file that specifies information about the physical object or physical system, including information about the size and geometry of one or more portions of the physical object or physical system and other properties of the physical object or physical system such as the materials used to construct the physical object, etc. Then in operation 153, a data processing system can generate an initial tetrahedral mesh using conventional techniques such as an incremental Delaunay meshing algorithm based on input vertices or nodes from the surface mesh of the physical object or physical system. Then in operation 155, the data processing system can attempt to recover all non-intersecting faces after all input nodes have been inserted into the initial mesh, including nodes on boundary faces. Operation 155 can use conventional, known techniques to recover all of the non-intersecting faces at this point in the method shown in FIG. 3A. After operation 155, there may be a set of unrecovered boundary faces that represent intersecting exterior surfaces of the physical object (or set of physical objects). In operation 157 a list of all unrecovered faces is gathered, and in operation 159 a data processing system can find, by starting from a particular unrecovered face, another face that is intersecting the particular unrecovered face, such as one or more faces (triangles in this embodiment) that were in the original surface mesh but were not in the original tetrahedral mesh. FIG. 5 illustrates an example of an initial set of intersecting faces 301 that can be discovered by operation 159. The initial set of intersecting faces 301 includes the face 305 and the face 303 which intersect as shown at intersection 307. Operation 159 will be repeated for each of the unrecovered faces as the method loops back from operation 169 shown in FIG. 3B. For the first or initial unrecovered face, processing proceeds to operation 161, in which the data processing system identifies what can be referred to as cap faces from the current pair of intersecting faces, such as the initial set of intersecting faces 301 shown in FIG. 5; the data processing system can identify the cap faces by propagating from the current pair of intersecting faces (e.g., the initial set of intersecting faces 301) through their neighboring faces (i.e., those faces that are immediately adjacent to the initial set of intersecting faces 301) to find all intersecting or penetrating faces for each side (across one continuous intersection region) until both sides completely emerge out from the other side. The result of this discovery process in operation 161 identifies all of the faces that are cap faces that will be used to define a cavity on each side of the unrecovered boundary face(s). The propagation process can begin by identifying all penetrating nodes (e.g., penetrating node 237 shown in FIG. 4A) on the current pair of intersecting faces (e.g., the initial set of intersecting faces 301), and these penetrating nodes can be considered to be seed penetrating nodes. The data processing system can then propagate from these seed penetrating nodes to find all adjacent penetrating nodes. Then the data processing system can propagate from all penetrating nodes to find all penetrating faces and adjacent unmeshed boundary faces (such as the unrecovered boundary face(s). This process can identify two sets of cap faces.

Figure 4A:
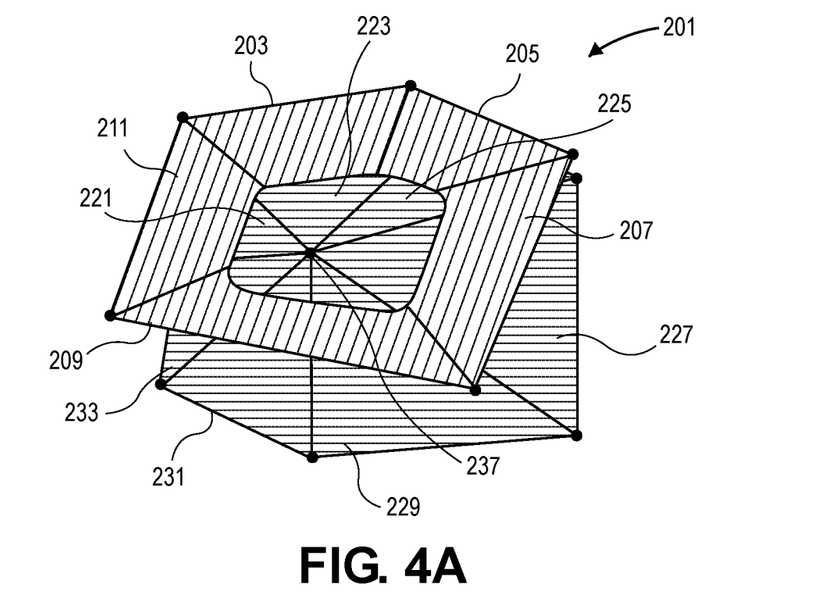
FIG. 4A shows a simple case where only one node from one side penetrates into the other side and the perspective view of a set of intersecting faces created in the input surface mesh.
Figure 4B:
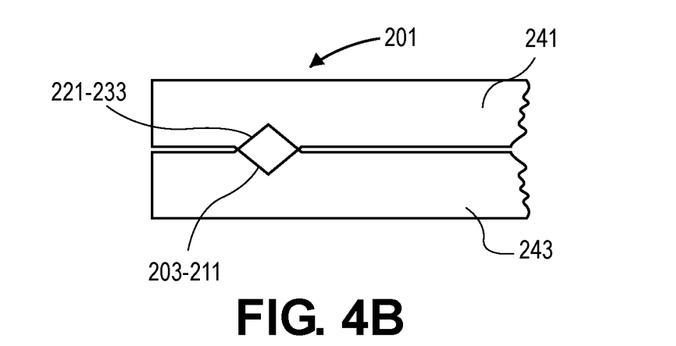
FIG. 4B shows a side view of the set of intersecting faces shown in FIG. 4A.

FIGS. 4A and 4B show a simple example of the result of operation 161 which has identified two sets of cap faces from the current pair of intersecting faces (after the propagation process through neighboring faces). As shown in FIG. 4A, a first set of cap faces on one side (a first side) includes faces 203, 205, 207, 209, and 211; these faces penetrate into the other side (a second side) and form a penetrating node (not shown in the view of FIG. 4A) that is behind the second set of cap faces in the view of FIG. 4A. The second set of cap faces (from the second side) include faces 221, 223, 225, 227, 229, 231, and 233 and these faces (in the second set of cap faces) penetrate into the first side and form a penetrating node 237 in the first side. FIG. 4A is a top perspective view of the set of intersecting faces 201 formed by the first and the second sets of cap faces. FIG. 4B is a side (or cross sectional) view of the set of intersecting faces 201 that penetrate in the first portion 241 and the second portion 243 of a self-contacting body that includes the first portion 241 and the second portion 243. The first set of cap faces penetrate into the second portion 243 and the second set of cap faces penetrate into the first portion 241.

After the data processing system has identified two sets of cap faces through operation 161, the data processing system can perform operation 163 in FIG. 3A. In operation 163, the data processing system can, from the first set of cap faces and the second set of cap faces and their mesh nodes, identify a set of adjacent tetrahedral elements which will be sculpted out to create two cavities which are separated by the cap faces including the unrecovered boundary face(s). In one implementation of operation 163, the data processing system can mark cells (e.g., tetrahedral elements) to be removed by first finding cells adjacent to interior nodes of cap faces and finding cells adjacent to interior edges of cap faces, and these cells that are found are marked to be removed (sculpted out). Further, the data processing system can, in this implementation, propagate outwards to include cells whose nodes are all on cells to be removed or exterior nodes and then propagate outwards to include cells whose edge intersects cap faces.

Figure 6A:
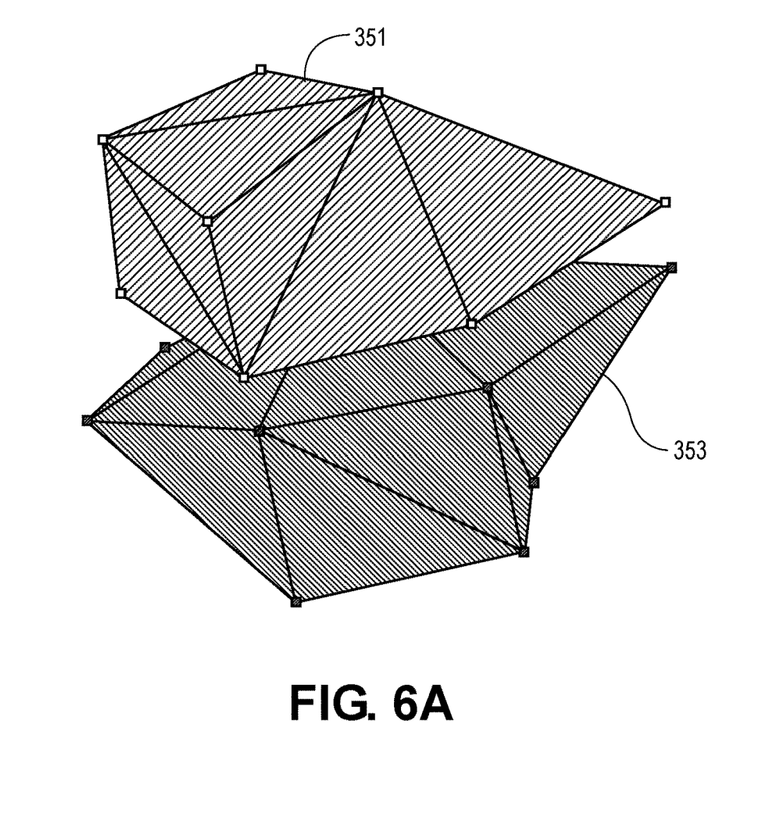
FIGS. 6A and 6B illustrate an example of two separately meshed cavities created from a set of intersecting faces, such as the set of intersecting faces shown in FIG. 4A, after performing at least some of the operations of the method shown in FIG. 2 or the method shown in FIGS. 3A & 3B.
Figure 6B:
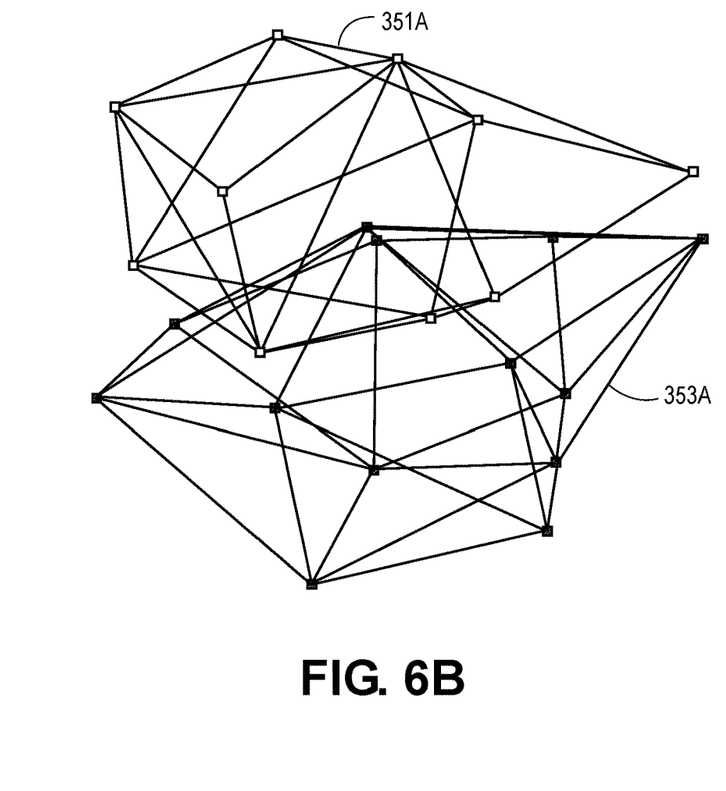

Following operation 163, the data processing system can perform operation 165 shown in FIG. 3B. In operation 165, the data processing system forms two cavities from a void created by removing the tetrahedral elements or cells which were marked to be removed in operation 163 in one implementation. The two cavities should be free of intersections within each cavity, and the boundary of each cavity is defined by a set of faces consisting of interfacing triangles between tetrahedron sculpted and tetrahedron kept, and one set of cap faces including the unrecovered boundary face(s). In one implementation, each cavity can be identified as a region between the respective set of cap faces and the boundary faces of cells to be removed. FIGS. 6A and 6B show an example of two cavities that have been formed, such as cavity 351 and cavity 353 in the case of FIG. 6A; FIG. 6B shows a wireframe view of these cavities shown as cavity 351A and cavity 353A.

After the two cavities are formed in operation 165, the data processing system can perform operation 167 to produce a tetrahedral mesh within each cavity. In one implementation, the data processing system can separately generate tetrahedral elements within each cavity using the same tetrahedral meshing algorithm in each cavity. After a mesh has been generated for each cavity, the two meshed cavities can be stitched back into the void of the original region from which the cavities were formed. The result of the stitching operation in operation 167 produces a valid tetrahedral mesh with the self-intersecting input surface mesh respected through the method shown in FIGS. 3A and 3B by the insertion of a first cavity that has been meshed and the insertion of a second cavity that has been meshed Thus, the method shown in FIGS. 3A and 3B can be done automatically by a data processing system to create a valid tetrahedral mesh which respects a set of intersecting faces without requiring any user or human input or guidance through the process of recovering the faces in the input surface mesh. In other words, operations 157 through 169 can be done automatically and repeatedly by the data processing system without requiring intervention by the human designer of the physical object. After operation 167, the data processing system can determine in operation 169 whether or not all faces have been recovered. If further unrecovered faces still exist and have not been recovered, then processing returns to operation 159. Otherwise, processing can proceed to operation 171 in which the data processing system can continue with conventional meshing routines and operations which can include operations to refine the mesh that exists at this point in the process.

In this description, a face will be understood to mean a triangle (or other geometric primitive) that is used in a meshing process or algorithm as a fundamental component of the mesh that is created; in other words, a face is a basic building block of a mesh and can take the form of a triangle (or other geometric primitive shape). A surface mesh is a mesh formed on a surface of an object (such as exterior surfaces 54 & 55) that is created from a set of faces, such as a set of triangles that interface each other by sharing edges and vertices; thus a surface mesh can be formed from a set of triangles that cover the surface (such as exterior surfaces 54 & 55) of an object. In this description, an initial tetrahedral mesh in one embodiment will be understood to mean an initial tetrahedral mesh that is created by a meshing process or algorithm before any interior nodes are inserted; this is a temporary stage in the meshing process. Tetrahedral meshing (or other forms of volume meshing) normally use a surface mesh as an input to start the meshing process or algorithm. An unrecovered face, in one embodiment, is a triangle (or other geometric primitive) that was in the surface mesh (used as an input to create an initial tetrahedral mesh) but is not in the initial tetrahedral mesh that was created from the surface mesh. A set of cap faces is a set of faces from input surface mesh that are used to form part of the boundary of a cavity created in the methods described herein; in other words, the cap faces are the boundary faces that separate a cavity created in the methods described herein. A boundary face may be defined as a face on an exterior surface of an object.

The embodiments can be used for meshing for NLAD (non-linear adaptivity) simulations and fracture growth simulations in which self-intersecting boundaries are often seen. It can also be used for any other scenarios which need tetrahedral meshing with self-intersecting boundaries.

Some implementations may include an embodiment that deals with special cases where two points (e.g., a first and second points for nodes) have the same location. In order to insert the second point, the implementation can offset the second point inward within the mesh region a small amount in the simulated physical space and then revert back the off set point to its original location after the meshing is done.

With the embodiments described herein, input boundaries (e.g., in the data received or generated in operation 151) are fully respected and there will be no quality degradation due to boundary modification. At the self-intersecting regions, these embodiments have "unglued" self-intersecting volume elements which follow the input boundaries. The embodiments can be used to mesh models for non-linear adaptivity (NALD) simulations and fracture growth simulations in which self-intersecting boundaries are often seen.

Figure 7:
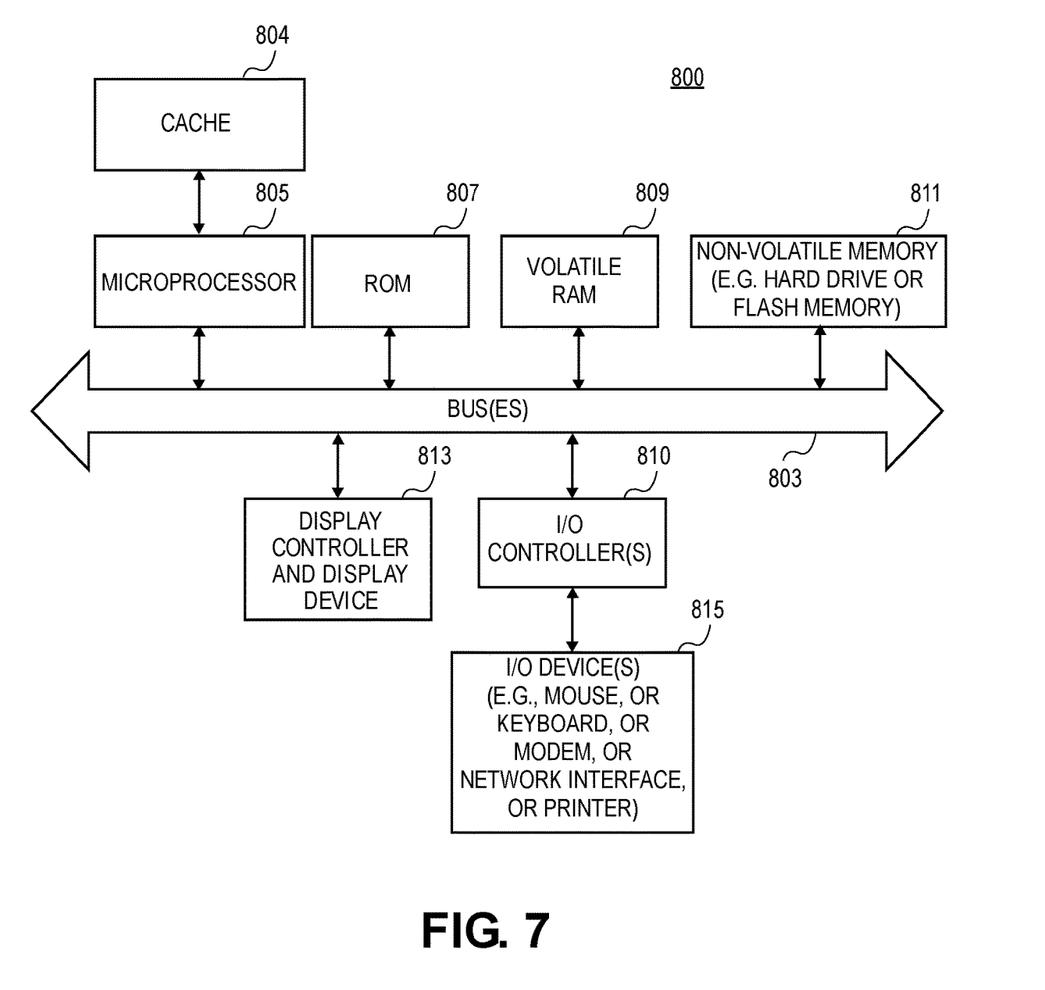
FIG. 7 shows an example of a data processing system which can be used to perform one or more methods described herein, such as the method shown in FIG. 2 or the method shown in FIGS. 3A and 3B.

FIG. 7 shows one example of a data processing system 800, which may be used with one embodiment. For example, the system 800 may be implemented to provide a client system or device that performs the method of FIG. 2 or 3A and 3B. Note that while FIG. 7 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 7, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 8 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable instructions which when executed by a data processing system cause the data processing system to perform a machine implemented method, the method comprising:
   generating an initial tetrahedral mesh for a simulation of a physical object, the initial tetrahedral mesh generated based on a surface mesh that contains self-intersecting faces;
   recovering, from the initial tetrahedral mesh, faces from the surface mesh after the initial tetrahedral mesh is generated wherein at least one face is not recovered and is an unrecovered face;
   detecting a set of intersecting faces inside the initial tetrahedral mesh around the unrecovered face from the surface mesh to define a sculpted region to be sculpted out and forming two intersection-free cavities which comprise a first cavity and a second cavity, wherein the self-intersecting faces include the set of intersecting faces, and the set of intersecting faces includes the unrecovered face;
   generating new tetrahedral meshes independently for both the first and the second cavities and
   stitching the new tetrahedral meshes back to a portion defined by the initial tetrahedral mesh without the sculpted region.

2. The medium as in claim 1 wherein the first and the second cavities in a three dimensional space are topologically separate.

3. The medium as in claim 2 wherein the first cavity is on a first side of the sculpted region that surrounds the unrecovered face and the second cavity is on a second side of the sculpted region.

4. The medium as in claim 3 wherein the first and the second cavities are meshed independently to generate the new tetrahedral meshes.

5. The medium as in claim 4 wherein no faces intersect each other within each of the first and the second cavities.

6. The medium as in claim 4 wherein a list of all unrecovered faces is gathered after the initial tetrahedral mesh has been generated.

7. The medium as in claim 1, wherein the detecting of the set of intersecting faces comprises: finding a face that intersects with the unrecovered face.

8. The medium as in claim 7, wherein the detecting of the set of intersecting faces further comprises: from the unrecovered face and the face that intersects with the unrecovered face, propagate through their neighbors to find all intersecting or penetrating faces.

9. The medium as in claim 8 wherein the first cavity and the second cavity are contained in the sculpted region.

10. The medium as in claim 9 wherein the first and the second cavities are meshed using a tetrahedral meshing algorithm that is used for each of the first cavity and the second cavity.

11. A machine implemented method, the method comprising:
    generating an initial tetrahedral mesh for a simulation of a physical object, the initial tetrahedral mesh generated based on a surface mesh that contains self-intersecting faces;
    recovering, from the initial tetrahedral mesh, faces from the surface mesh after the initial tetrahedral mesh is generated wherein at least one face is not recovered and is an unrecovered face;
    detecting a set of intersecting faces in the initial tetrahedral mesh around the unrecovered face from the surface mesh to define a sculpted region to be sculpted out and forming two intersection-free cavities which comprise a first cavity and a second cavity, wherein the self-intersecting faces include the set of intersecting faces, and the set of intersecting faces includes the uncovered face;
    generating new tetrahedral meshes independently for both the first and the second cavities and
    stitching the new tetrahedral meshes back to a portion defined by the initial tetrahedral mesh without the sculpted region.

12. The method as in claim 11, wherein the first and the second cavities in a three dimensional space are topologically separate.

13. The method as in claim 12 wherein the first cavity is on a first side of the sculpted region that surrounds the unrecovered face and the second cavity is on a second side of the sculpted region.

14. The method as in claim 13, wherein the first and the second cavities are meshed independently to generate the new tetrahedral meshes.

15. The method as in claim 14, wherein no faces intersect each other within each of the first and the second cavities.

16. The method as in claim 14, wherein a list of all unrecovered faces is gathered after the initial tetrahedral mesh has been generated.

17. The method as in claim 16, wherein the detecting of the set of intersecting faces comprises: finding a face that intersects with the unrecovered face.

18. The method as in claim 17, wherein the detecting of the set of intersecting faces further comprises: from the unrecovered face and the face that intersects with the unrecovered face, propagate through their neighbors to find all intersecting or penetrating faces.

19. The method as in claim 18, wherein the first cavity and the second cavity are contained in the sculpted region.

20. The method as in claim 19, wherein the first and the second cavities are meshed using a tetrahedral meshing algorithm that is used for each of the first cavity and the second cavity.

\* \* \* \* \*